US011581889B2

(12) United States Patent
Lovett

(10) Patent No.: US 11,581,889 B2
(45) Date of Patent: Feb. 14, 2023

(54) SYSTEMS, METHODS, AND APPARATUSES FOR TEMPERATURE AND PROCESS CORNER SENSITIVE CONTROL OF POWER GATED DOMAINS

(71) Applicant: MICRON TECHNOLOGY, INC., Boise, ID (US)

(72) Inventor: Simon J. Lovett, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/397,630

(22) Filed: Apr. 29, 2019

(65) Prior Publication Data

US 2019/0253050 A1  Aug. 15, 2019

Related U.S. Application Data

(63) Continuation of application No. 15/251,908, filed on Aug. 30, 2016, now Pat. No. 10,305,471.

(51) Int. Cl.
*H03K 17/284* (2006.01)
*G11C 7/04* (2006.01)
(Continued)

(52) U.S. Cl.
CPC ......... *H03K 17/284* (2013.01); *G11C 5/148* (2013.01); *G11C 7/04* (2013.01); *G11C 7/065* (2013.01);
(Continued)

(58) Field of Classification Search
CPC ......... H03K 17/284; H03K 2217/0036; G11C 5/148; G11C 7/065; G11C 7/12; G11C 7/22; G11C 8/10
See application file for complete search history.

(56) References Cited

U.S. PATENT DOCUMENTS 6,552,601 B1  4/2003  Burr
7,193,427 B2  3/2007  Persun et al.
(Continued)

FOREIGN PATENT DOCUMENTS

CN   101606319 A   12/2009
CN   102823143 A A 12/2012
(Continued)

OTHER PUBLICATIONS

English Translation of First Office Action dated Aug. 6, 2018 for Taiwan application No. 106129184.
(Continued)

*Primary Examiner* — Ryan Johnson
*Assistant Examiner* — Colleen J O Toole
(74) *Attorney, Agent, or Firm* — Dorsey & Whitney LLP

(57) ABSTRACT

Apparatuses and methods for temperature and process corner sensitive control of power gated domains are described. An example apparatus includes an internal circuit; a power supply line; and a power gating control circuit which responds, at least in part, to a first change from a first state to a second state of a control signal to initiate supplying a power supply voltage from the power supply line to the internal circuit, and continue supplying the power supply voltage from the power supply line to internal circuit for at least a timeout period from a second change from the second state to the first state of the control signal, in which the timeout period represent temperature dependency.

21 Claims, 6 Drawing Sheets

(51) Int. Cl.

| | |
|---|---|
| *H03K 19/00* | (2006.01) |
| *H03K 19/003* | (2006.01) |
| *G11C 5/14* | (2006.01) |
| *G11C 29/02* | (2006.01) |
| *G11C 7/06* | (2006.01) |
| *G11C 7/12* | (2006.01) |
| *G11C 7/22* | (2006.01) |
| *G11C 8/10* | (2006.01) |
| G11C 8/06 | (2006.01) |
| G11C 29/04 | (2006.01) |
| G11C 29/50 | (2006.01) |

(52) U.S. Cl.
CPC .................. *G11C 7/12* (2013.01); *G11C 7/22* (2013.01); *G11C 8/10* (2013.01); *G11C 29/023* (2013.01); *G11C 29/028* (2013.01); *H03K 19/0016* (2013.01); *H03K 19/00384* (2013.01); *G11C 8/06* (2013.01); *G11C 2029/0409* (2013.01); *G11C 2029/5006* (2013.01); *H03K 2217/0036* (2013.01)

(56) References Cited

U.S. PATENT DOCUMENTS

| | | |
|---|---|---|
| 8,154,353 B2 | 4/2012 | Yeric |
| 8,689,031 B2 | 4/2014 | Hirano |
| 2006/0006929 A1 | 1/2006 | Caplan et al. |
| 2007/0025030 A1 | 2/2007 | Jung |
| 2007/0075743 A1 | 4/2007 | Oh |
| 2007/0146013 A1 | 6/2007 | Hsu et al. |
| 2008/0180157 A1 | 7/2008 | Choi et al. |
| 2010/0231255 A1 | 9/2010 | Kim et al. |
| 2012/0126879 A1 | 5/2012 | Sandhu et al. |
| 2012/0242392 A1 | 9/2012 | Kim |
| 2013/0099570 A1 | 4/2013 | Manohar et al. |
| 2013/0124890 A1 | 5/2013 | Priel et al. |
| 2013/0166931 A1 | 6/2013 | Castagnetti et al. |
| 2013/0173944 A1 | 7/2013 | Kohler et al. |
| 2014/0015590 A1 | 1/2014 | Yoon et al. |
| 2015/0280703 A1 | 10/2015 | Jeon |
| 2016/0217848 A1 | 7/2016 | Ishizu et al. |
| 2016/0241240 A1 | 8/2016 | Suzuki et al. |
| 2018/0062640 A1 | 3/2018 | Lovett |

FOREIGN PATENT DOCUMENTS

| | | |
|---|---|---|
| KR | 20100013591 A | 2/2010 |
| KR | 1020100013591 A | 2/2010 |

OTHER PUBLICATIONS

International Search Report and Written Opinion dated Nov. 22, 2017 for PCT Application No. PCT/US2017/047093.
Decision of the Intellectual Property Office for TW application No. 106129184 dated Feb. 19, 2019, pp. all.
International Preliminary Report on Patentability for PCT Application No. PCT/US2017/047093 dated Mar. 14, 2019 , pp. all.
EESR dated Jun. 18, 2020 for EP Application No. 17847204.9, 10 pgs.
KR Office Action dated Apr. 13, 2020 for KR Application No. 10-2019-7006514, 9 pgs.
Second Office Action dated Apr. 16, 2020 for TW Application No. 106129184, 10 pgs, pp. all.
EP Office Action dated Sep. 27, 2021 for EP Appl. No. 17847204.9; pp. all.
EN translation of CN Office Action dated Oct. 8, 2022 for CN Application No. 201780053024.5.

SYSTEMS, METHODS, AND APPARATUSES FOR TEMPERATURE AND PROCESS CORNER SENSITIVE CONTROL OF POWER GATED DOMAINS

CROSS REFERENCE TO RELATED APPLICATION(S)

This application is a continuation of pending U.S. patent application Ser. No. 15/251,908. filed Aug. 30, 2016, which issued as U.S. Pat. No. 10,305,471 on May 28. 2019. The aforementioned application and patent are incorporated herein by reference, in their entirety for any purpose.

BACKGROUND

High performance and reduced power consumption are important factors for semiconductor devices, especially for mobile applications. For various integrated circuit (IC) components, power gating has emerged as a technique for mitigating subthreshold leakage in low threshold voltage transistors, logic blocks, circuits, and other devices. In a power gated configuration, groups of transistors, logic blocks, circuits, etc. may be selectively coupled and decoupled from a power supply. In this way, the specific groups of transistors, logic blocks, circuits, etc. may be selectively provided power on an individual basis, as controlled by a power gating circuit. Typically, the power gating circuit couples each of the groups via low leakage, high threshold voltage switches, such as a complementary metal-oxide-semiconductor (CMOS) switch, controlled by power gating controllers. For example, a low-leakage P-type metal-oxide-semiconductor (PHOS) transistor may be utilized as a header switch to shut off first supply voltage to the parts of a circuit in a standby state, while a low-leakage N-type metal-oxide-semiconductor (NMOS) transistor may be used as a sleep transistor shutting off second supply voltage.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Several embodiments are described herein, and while yahoos features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
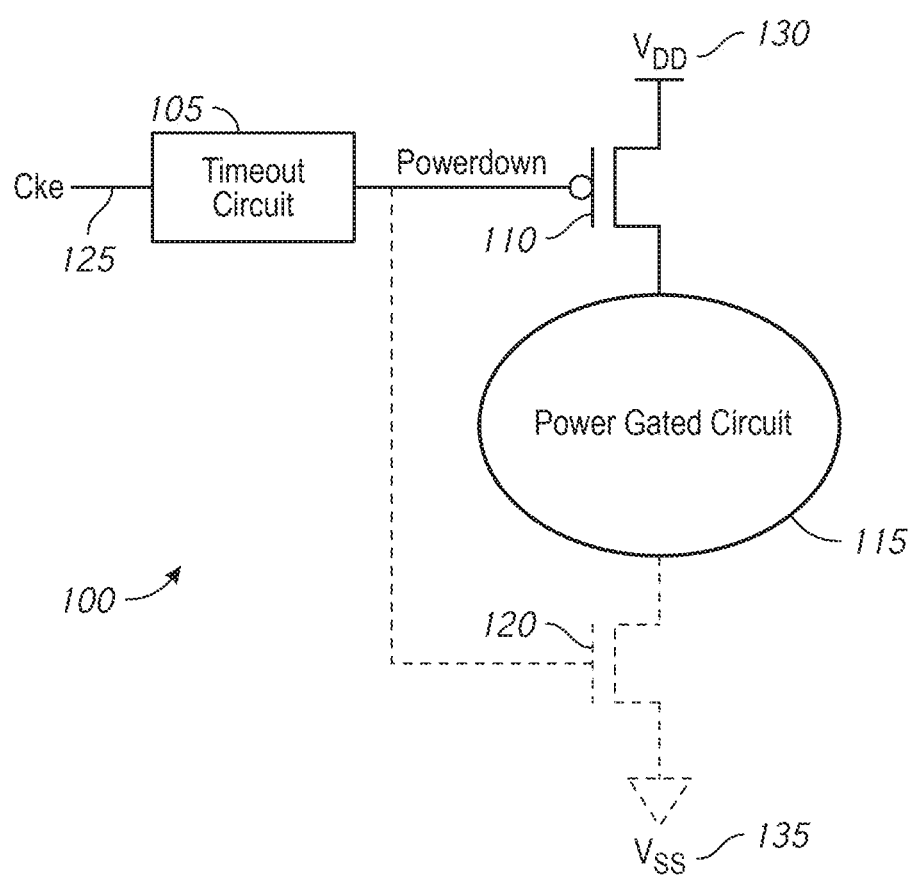
FIG. 1 is a schematic block diagram of a power gating control circuit, in accordance with various embodiments.

FIG. 1 illustrates a power gating circuit 100, according to various embodiments. The power gating circuit 100 may include a timeout control circuit 105, header switch 110, power gated circuit 115, footer switch 120, enable signal (e.g. clock enable (Cke)) input 125, first supply voltage ($V_{DD}$) 130, and second supply voltage ($V_{SS}$) 135. In various embodiments, the power gated circuit 115 may include transistors that have relatively low threshold voltages (e.g., 0.4V or less). These low threshold voltage transistors are often susceptible to relatively high leakage currents during, for example, standby operation due to the supply voltages (e.g., $V_{dd}$ and $V_{ss}$) provided to the circuit. Additionally, in various embodiments, the timeout control circuit 105 may be communicatively coupled to one or more power gating switches. Power gating switches may be configured to couple the power gated circuit 115 to at least one of a first power supply or a second power supply. The power gating switches may be configured to be activated in a conductive state, or deactivated in a non-conductive state. In various embodiments, power gating switches may include a header switch 110, footer switch 120, or both. For example, in some embodiments, the timeout control circuit 105 may be communicatively coupled to the header switch 110, footer switch 120, or both. The header switch 110, may in turn couple the power gated circuit 115 to a first power supply line, $V_{DD}$ 130. In some embodiments, the footer switch 120 may be used alternatively, or in addition to, the header switch 110. The footer switch 120 may be configured to couple the power gated circuit 115 to a second power supply line, $V_{SS}$ 135.

By controlling supply power to the power gated circuit 115 via at least one of the header switch 110 or footer switch 120, the power gated circuit 115 may be considered to have a power domain that is specific to the power gated circuit 115. Accordingly, power may be provided to, or shut off from, power gated circuit 115 without affecting power supplied to other parts of the circuit, chip, or device.

According to various embodiments, header switch 110 may be a high threshold voltage, low leakage PMOS transistor. In one set of embodiments, the threshold voltage for the header switch 110 may be at least 0.5V. In other words, the threshold voltage for the header switch 110 may be greater than the threshold voltage for the transistors of the gated circuit 115. Accordingly, inherent to the higher threshold voltage, the header switch 110 may exhibit much less leakage current than the power gated circuit 115.

In further embodiments, the footer switch 120 may be a high threshold voltage, low leakage NMOS transistor. In one set of embodiments, like the header switch 110, the footer switch 120 may have a threshold voltage of at least 0.5V. In other words, the threshold voltage for the header switch 120 may be greater than the threshold voltage for the transistors of the gated circuit 115. The footer switch 120 may also exhibit less leakage current than the power gated circuit 115.

According to various embodiments, header switches 110 and footer switches 120 typically have very large total transistor width. For example, in one set of embodiments, the header switch 110 or footer switch 120 may have a gate width (W) that is four times larger than the total device W of the power gated circuit 115.

According to various embodiments, power gated circuit 115 may include all or part of an internal circuit. The internal circuit may include, but not limited to, sections and circuits of row decoders and column decoders, for example. This may include, without limitation, row decoder circuits and control logic, wordline drivers, column decoder circuits and control logic, bitline drivers, read/write circuits, sense amplifiers, sense amplifier gap control logic, write drivers, and other memory components and subsystems. In some embodiments, the power gated circuit 115 may be a low threshold voltage circuit created including a plurality of low threshold voltage devices. In one set of embodiments, the low threshold voltage devices may have threshold voltages of 0.4V or below. Accordingly, in some embodiments, the power gated circuit 115 may include a first transistor with a first threshold voltage lower, and at least one of the header switch 110 or footer switch 120 may have a second threshold voltage greater in absolute value than the first threshold voltage.

As will be described in more detail below, with respect to FIG. 2, the timeout control circuit 105 may be configured to adjust a timeout delay responsive to operation parameters, for example, an operating temperature and process corner of a particular power gated circuit 115. As will be appreciated by those skilled in the art, the higher the temperature, the more leakage will occur. The subthreshold leakage generally has an exponential relationship to temperature. Moreover, the amount of leakage current exhibited by a specific power gated circuit 115 will vary based on process corner variation. As will be described in further detail in the embodiments below, in some embodiments, the timeout control circuit 105 may be configured to respond to changes in subthreshold leakage due to temperature fluctuations close to, or substantially in real-time. In various embodiments, temperature dependency of the timeout circuit 105 may include, without limitation, the ability of the timeout circuit 105, or elements of the timeout circuit 105 (e.g., leakage monitors), to adjust a timeout period based on operating temperatures of the power gated circuit 115.

Once header switch 110, footer switch 120, or both header and footer switches 110, 120 are activated via the timeout control circuit 105, the timeout control circuit 105 prevents deactivation of the header and footer switches 110, 120 for the duration of a timeout delay. The timeout delay may be configured to be responsive to at least one of the operation parameters, for example, a temperature and process corner of a particular power gated circuit 115.

In operation, a powerdown signal may be provided by the timeout control circuit 105, based on Cke input 125. In various embodiments, the Cke input 125 may correspond to a clock enable signal. The clock enable signal may be a control signal that enables a memory clock input. For example, when clock enable is low, a memory chip may behave as if the clock as stopped. Normal operation may resume when clock enable is high. Accordingly, clock enable may correspond to access activity on the device or circuit. In response to receiving a high clock enable signal at the Cke input 125, the timeout control circuit 105 may provide an activation signal to the header switch 110, footer switch 120, or both, thereby resupplying power to the power gated circuit 115. Conversely, a low clock enable signal at the Cke input 125 may indicate inactivity on the device. Accordingly, in response to receiving the low clock enable signal at the Cke input 125, the timeout control circuit 105 may provide a powerdown signal to the header switch 110, footer switch 120, or both, thereby shutting off power to the power gated circuit 115. In various embodiments, the timeout control circuit 105 may delay generating the powerdown signal for the duration of a timeout delay. For example, in one set of embodiments, when clock enable switches to a low state and remains at the low state, clock enable must remain low for the duration of the timeout delay before a powerdown signal is generated. If clock enable switches to a high state before the timeout delay has elapsed, the powerdown signal will not be generated until clock enable returns to a low state and remain low for a second specified duration less than or equal to the timeout delay. In some embodiments, the duration of the timeout delay may be adjusted based, at least in part, on the temperature of the power gated circuit 115. In other embodiments, the duration of the timeout delay may also be determined based, at least in part, on process corner characteristics of the power gated circuit 115. In further embodiments, the duration of the timeout may be responsive to both temperature and process corner characteristics of the power gated circuit 115.

Figure 2:
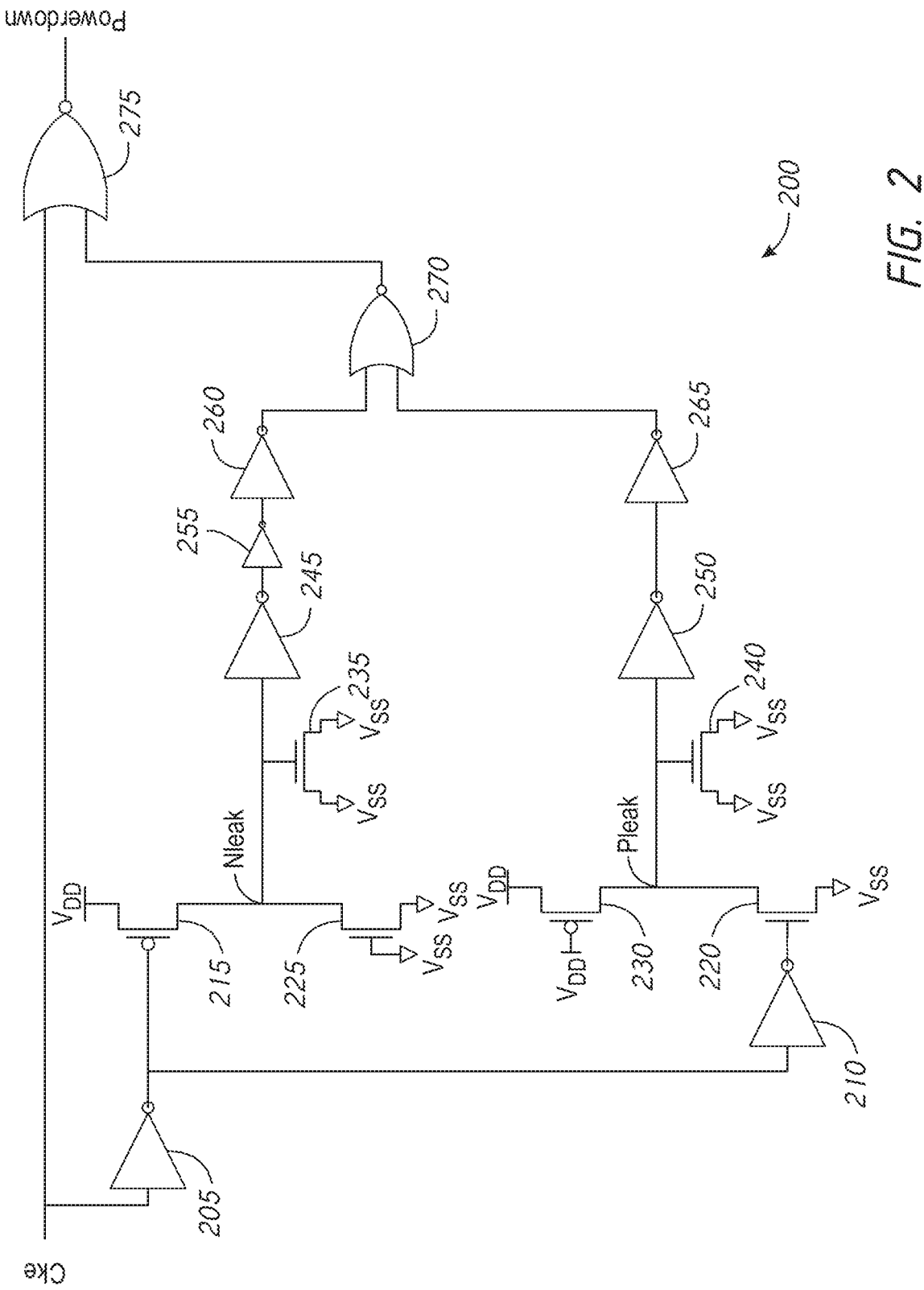
FIG. 2 is a schematic diagram of a timeout control circuit, in accordance with various embodiments.

FIG. 2 illustrates an example of one such timeout control circuit 200, in accordance with various embodiments. The timeout control circuit 200 may include a first input inverter 205, second input inverter 210, first precharge switch 215, second precharge switch 220, first leakage monitor 225, second leakage monitor 230, first capacitor 235, second capacitor 240, first trigger inverter 245, second trigger inverter 250, buffer inverter 255, first output inverter 260, second output inverter 265, trigger NOR gate 270, and output NOR gate 275.

According to various embodiments, the input of the input inverter 205 may be coupled to a clock enable line and accept a clock enable signal. The output of the first input inverter 205 may be coupled to the first precharge switch 215, and the second input inverter 210. The output of the second input inverter 210 may in turn be coupled to the second precharge switch 220. In various embodiments, the first precharge switch 215 may be a PMOS transistor. The gate of the PMOS transistor may be coupled to the output of the input inverter 205, the source of the PMOS transistor may be coupled to $V_{DD}$, and the drain of the PMOS transistor may be coupled to monitor node Nleak being precharged. Correspondingly, the second precharge switch 220 may be an NMOS transistor switch. The gate of the NMOS transistor switch may be coupled to the output of the second input inverter 210, the source of the NMOS transistor switch may be coupled to $V_{SS}$, and the drain of the NMOS transistor switch may be coupled to monitor node Pleak being precharged.

Operationally, in various embodiments, when the clock enable signal at Cke is high, the input inverter 205 may output a low signal to the first precharge switch 215. In turn, the second input inverter 210 may provide a high signal to the second precharge switch 220. When a low signal is provided to the first precharge switch 215, the first precharge switch 215 may become conductive, precharging the monitor node Nleak to $V_{DD}$. Correspondingly, when a high signal is provided to the second precharge switch 220, the second precharge switch 220 may become conductive, precharging the monitor node Pleak to $V_{SS}$. When the clock enable signal at Cke transitions low, a high signal may be provided to the first precharge switch 215, and a low signal may be provided to second precharge switch 220. In response, the first precharge switch 215 and second precharge switch 220 may be opened, disconnecting $V_{DD}$ from monitor node Nleak, and $V_{SS}$ from monitor node Pleak respectively.

The monitor node Nleak may be coupled to a first leakage monitor 225, first capacitor 235, and first trigger inverter 245. In various embodiments, the first leakage monitor 225 may be configured to model leakage through N-type devices, such as, without limitation, N-type transistors, in a power gated circuit 115, to which the timeout control circuit 200 is coupled. The first leakage monitor 225 may include one or more N-type devices fabricated using the same fabrication process as the N-type devices in the power gated circuit 115. For example, in various embodiments the first leakage monitor 225 may have the same transistor types, having, without limitation, the same doping, threshold voltages, and other characteristics as the N-type transistors in the power gated circuit 115. The first leakage monitor 225 may also use one or more N-type transistors, sized with identical channel length as the N-type transistors in the power gated circuit 115. In one set of embodiments, the first leakage monitor 225 may be sized with an identical channel length and a W that is sized at no less than five times the minimum W allowed for the process technology utilized in the low voltage threshold circuit. The 5× multiple may guarantee that sigma variability for the individual legs of the first leakage monitor 225 with respect to, without limitation, threshold voltage, mobility, and other characteristics, represents an average for the power gated circuit 115 being modeled.

In this way, the first leakage monitor 225 may exhibit the same process corner characteristics and model subthreshold leakage in the N-type devices of the power gated circuit 115. In one set of embodiments, the first leakage monitor 225 may include a single N-type device. In other embodiments, the first leakage monitor 225 may include multiple N-type devices in one or more of the individual legs. By utilizing N-type devices fabricated using the same fabrication process as in the power gated circuit 115, process corner characteristics may be modeled. Moreover, the first leakage monitor 225 may be placed under similar operating conditions as the power gated circuit 115. For example, the first leakage monitor 225 may be subject to similar temperature conditions. In various embodiments, the first leakage monitor 225 may be placed in close proximity to the power gated circuit 115, for example, on the same chip or die, and similarly powered or unpowered. In other embodiments, the first leakage monitor 225 may be placed on a different chip or die, but configured to experience temperature conditions modelling the power gated circuit 115.

In various embodiments, the first capacitor 235 may be one or more of an NMOS or PMOS transistor. When an NMOS transistor is utilized, both source and drain may be tied to $V_{SS}$ and the gate connected to the monitor node Nleak. When a PMOS capacitor is utilized, both source and drain may be tied to $V_{DD}$, with the gate connected to the monitor node Nleak.

Similarly, monitor node Pleak may be coupled to a second leakage monitor 230, second capacitor 240, and second trigger inverter 250. In various embodiments, the second leakage monitor 230 may be configured to model the leakage through all P-type devices, such as, without limitation, P-type transistors, in power gated circuit 115, to which the timeout control circuit 200 is coupled. The second leakage monitor 230 may include one or more P-type devices fabricated using the same fabrication process as the P-type devices in the power gated circuit 115. For example, in various embodiments the second leakage monitor 230 may include the same transistor types, having, without limitation, the same doping, threshold voltages, and other characteristics as the P-type transistors in the power gated circuit 115. The second leakage monitor 230 may include one or more transistors, sized with identical channel length as the P-type transistors in the power gated circuit 115. In one set of embodiments, like the first leakage monitor 225, the second leakage monitor 230 may have a W that is sized at no less than five times the minimum W allowed for the process technology utilized in the power gated circuit 115.

In this way, the second leakage monitor 230 may exhibit the same process corner characteristics and model subthreshold leakage in the P-type devices in the power gated circuit 115. In one set of embodiments, the second leakage monitor 230 may include a single P-type transistor. In other embodiments, the second leakage monitor 230 may include multiple P-type transistors in one or more of the individual legs. As with the first leakage monitor 225, the second leakage monitor 230 may be placed under similar operating conditions as the power gated circuit 115. In this manner, the second leakage monitor 230 may be configured to be subject to similar temperature conditions, and to exhibit similar process corner characteristics.

In various embodiments, as with the first capacitor 235, second capacitor 240 may be one or more of an NMOS or PMOS capacitor, and may be configured similarly to the first capacitor 235, but in relation to the monitor node Pleak. For example, when an NMOS transistor is utilized, both source and drain may be tied to $V_{SS}$ and the gate connected to the monitor node Pleak. When a PMOS capacitor is utilized, both source and drain may be tied to $V_{DD}$, with the gate connected to the monitor node Pleak.

Therefore, in accordance with various embodiments, the timeout control circuit may include a capacitive element, such as first capacitor 235 and second capacitor 240, and a resistive element coupled to the capacitive element, such as first leakage monitor 225, second leakage monitor 230. In some embodiments, the first leakage monitor 225 or second leakage monitor 230 may be configured to charge the first and second capacitors 235, 240 respectively. As current begins to leak through the first and second leakage monitors 230, the first and second leakage monitors 230 may act as resistive elements configured to discharge the capacitive element.

In accordance with various embodiments, the signal at monitor node Nleak may be tied to the input of a first trigger inverter 245. Correspondingly, the signal at monitor node Pleak may be tied to the input of the second trigger inverter 250. Thus, the signal output by the first trigger inverter 245 and the second trigger inverter 250 will reflect N-channel and P-channel subthreshold leakage through each of the first leakage monitor 225 and second leakage monitor 230, respectively. For example, in operation, when Cke is high, the outputs of the first trigger inverter 245 is held at a logical low while the outputs of the second trigger inverter 250 is held at a logical high. When Cke is low, and both first and second precharge switches 215, 220 are turned off, input signals provided to the first and second trigger inverters 245, 250 will slowly leak towards their complementary voltage rails as current leaks through the respective first and second leakage monitors 225, 230. For example, the signal input at monitor node Nleak to the first trigger inverter 245 will initially be precharged at $V_{DD}$. When the first precharge switch 215 is shut off, the signal input at monitor node Nleak will slowly leak through the first leakage monitor 225, towards complement power rail $V_{SS}$. Eventually, the voltage at the monitor node Nleak will be low enough to trigger the first trigger inverter 245. In turn, the first trigger inverter 245 may output a signal having a logic high, indicating that leakage through the first leakage monitor 225 has caused the voltage at monitor node Nleak to be less than the trigger voltage ($V_{trigg}$) of the first trigger inverter 245. In one set of embodiments, the logic high output of first trigger inverter 245 may be at $V_{DD}$. Complementing the N-channel side of the circuit, the signal input at monitor node Pleak to the second trigger inverter 250 will initially be precharged to $V_{SS}$. When the second precharge switch 220 is shut off, the signal input will slowly be pulled up to complement power rail $V_{DD}$. Eventually, the voltage at monitor node Pleak will be high enough to trigger the second trigger inverter 250. In turn, the second trigger inverter 250 may output a signal having a logic low, indicating that the leakage through the second leakage monitor 230 has caused the voltage at monitor node Pleak to be greater than $V_{trigg}$ of the second trigger inverter 250. In one set of embodiments, logic low may be $V_{SS}$.

In various embodiments, the output of the first trigger inverter 245 may be coupled to the input of buffer inverter 255, which in turn has an output coupled to a first output inverter 260. The output of the second trigger inverter 250 may, in turn, be coupled to the input of a second output inverter 265. In various embodiments, the buffer inverter 255, and first output inverter 260 may be configured such that the output characteristics of first output inverter 260 is matched to the output characteristics of second output inverter 265. In this way, the first output inverter 260 may output a signal tied to a first input of trigger NOR gate 270, and the second output inverter 265 may output a signal tied to a second input of the trigger NOR gate 270.

According to various embodiments, in operation, when the clock enable signal is low, the outputs at both of the first and second output inverters 260, 265 will eventually switch to logical high, reflecting that the subthreshold leakage through the first leakage monitor 225 and second leakage monitor 230, respectively have crossed the respective $V_{trigg}$ of the first and second trigger inverters 245, 250. In various embodiments, the trigger NOR gate 270 may be configured to have a comparator threshold that may be less than $V_{DD}$. Therefore, whichever of the first input, corresponding to N-channel leakage, or the second input, corresponding to P-channel leakage, crosses the comparator threshold first will cause the trigger NOR gate 270 to output a logic low signal. Thus, the output of the trigger NOR gate 270 is controlled by whichever of subthreshold leakage in the first or second leakage monitors 225, 230 is greater.

The output of the trigger NOR gate 270 may be tied then to a second input of the powerdown NOR gate 275, while a first input of the powerdown NOR gate 275 may be tied to Cke input 125 providing the clock enable signal. Accordingly, when clock enable is low, and the output of the trigger NOR gate 270 is low, a logic high is asserted signaling entry into powerdown mode for the power gated circuit 115. Thus, the duration of the timeout delay may correspond to the delay between when the clock enable signal is low, and when a logic low signal is output by the trigger NOR gate 270 and received at the second input of the powerdown NOR gate 275. Thus, the power gated circuit 115 will remain powered until the duration of the timeout delay has elapsed. In other words, only if clock enable remains low for the duration of the timeout delay will the powerdown signal be asserted.

Thus, according to various embodiments, the length of time for the inputs of the trigger NOR gate 270 to cross the comparator threshold is directly related to the power leakage through first and second leakage monitors 225, 230. Therefore, the duration of the timeout delay may be adjusted, on a first side of the timeout circuit 200 by adjusting the size of the first leakage monitor 225, and the first capacitor 235. The timeout duration may be adjusted on a second side of the timeout circuit 200 by adjusting the size of the second leakage monitor 230 and second capacitor 240. In this way, the duration of the timeout delay may be adjusted while maintaining responsiveness to both temperature and process corner of the power gated circuit 115. In one set of embodiments, an optimal timeout duration may be determined based on leakage current for the power gated circuit 115, and a switching current for the header switch 110, footer switch 120, or both header and footer switches 110, 120. For example, if subthreshold leakage for the power gated circuit 115 is 1 mA at a temperature of 90 C, and 0.1 mA at a temperature of 25 C, timeout delay may be determined based on a switching current of the header and footer switches 110, 120, which are substantially independent of temperature. In one set of embodiments, the switching current for the header and footer switches 110, 120 may be 10 mA for the duration of 1 ns. Thus, at a temperature of 90 C, it would be inefficient for the header and footer switch 110, 120 to be switched off before 20 ns have elapsed, as a 1 mA leakage current for a duration of 20 ns is equivalent in power to two transient pulses of 10 mA for a 1 ns duration. Similarly, at a temperature of 25 C, it would be inefficient for the header and footer switch 110, 120 to be switched off before 200 ns have elapsed. Thus, the first and second leakage monitors 225, 230 and first and second capacitors 235, 240 may respectively be configured to produce a 20 ns timeout delay at a temperature of 90 C, and a 200 ns timeout delay at a temperature of 25 C. It will be appreciated that the values used above were chosen for simplicity in describing the example conceptually. In other embodiments, other values may be utilized corresponding to real-world leakage characteristics, temperature fluctuations, and variations in the design of the power gating circuit 200, such as the implementation of one or both of the header and footer switches 110, 120, and one or more of the first or second leakage monitors 225, 230 when setting a desired timeout delay.

Figure 3:
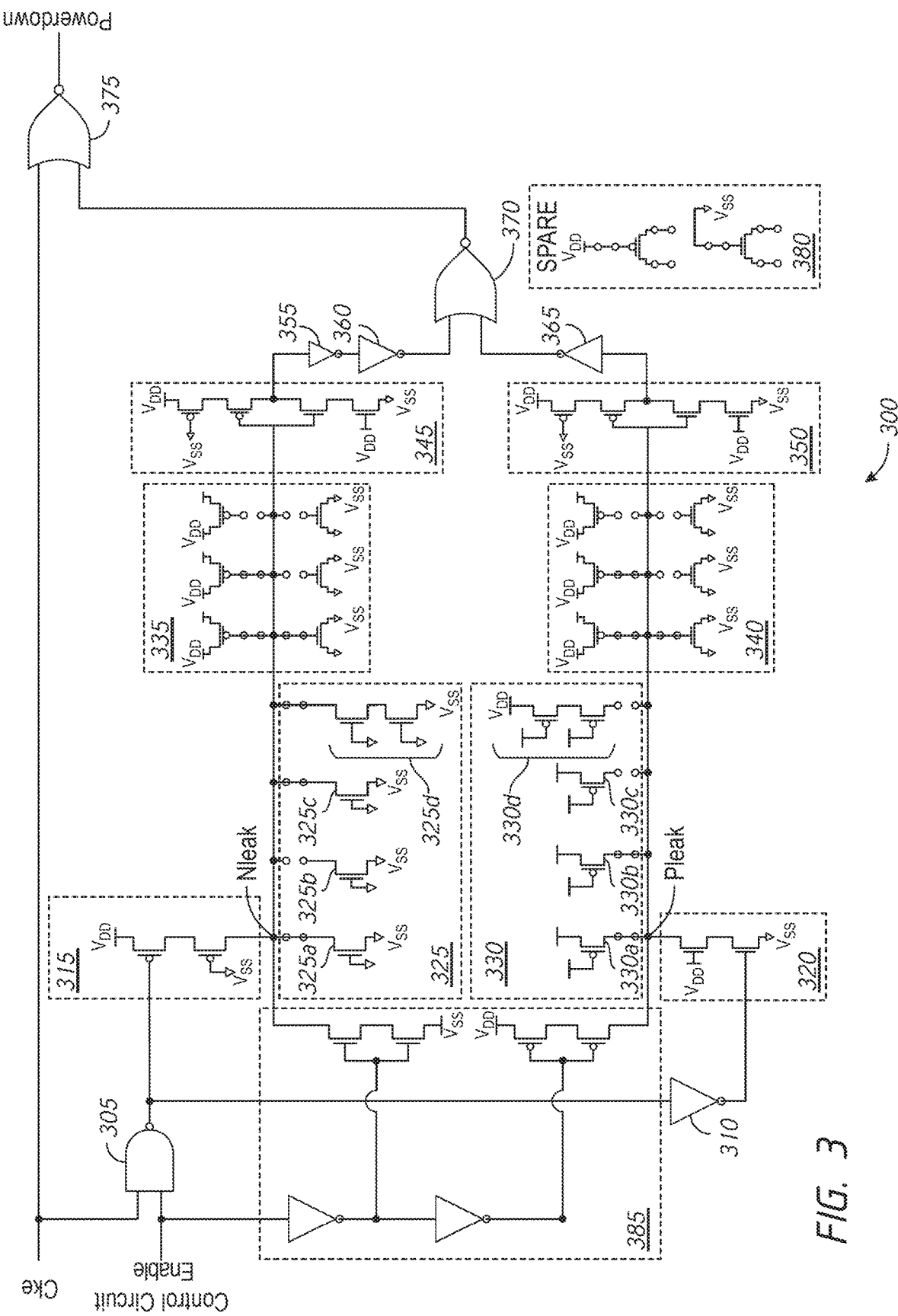
FIG. 3 is a schematic diagram of a trim circuit for a timeout control circuit, in accordance with various embodiments.

FIG. 3 illustrates a trim circuit implementation of a timeout control circuit 300 utilizing metal trim switch options, in accordance with various embodiments. Like the timeout control circuit 200 of FIG. 2, timeout control circuit 300 may include an input NAND gate 305, first input inverter 310, first precharge switch 315, second precharge switch 320, first leakage monitor 325, second leakage monitor 330, first capacitors 335, second capacitors 340, first trigger inverter 345, second trigger inverter 350, buffer inverter 355, first output inverter 360, second output inverter 365, trigger NOR gate 370, and output NOR gate 375. In addition to these elements, the timeout control circuit 300 may further include spare transistors 380, as well as a power gating enable circuit 385.

Compared to FIG. 2, the input NAND gate 305 may function analogously to the input inverter 205. In various embodiments, the input NAND gate 305 may receive two inputs, a clock enable signal input, and a control circuit enable input. Accordingly, only when both clock enable and control circuit enable are high, is a low signal output from the input NAND gate 305. This will, in turn, cause first and second precharge switches 315, 320 to be in a conductive state. When either of clock enable or control circuit enable are low, the first and second precharge switches 315, 320 are made non-conductive.

In various embodiments, the first leakage monitor 325 may include multiple legs 325a, 325b, 325c, 325d. Each leg 325a-325d may include one or more N-type devices, including, without limitation, N-type transistors. For example, individual leg 325d may include two N-type transistors, while legs 325a-325c each include a single N-type transistor. Each of the N-type devices may be fabricated utilizing the same process technology as the N-type devices in the power gated circuit 115. In one set of embodiments, each of the N-type devices in the first leakage monitor 325 may have a W that is sized at no less than five times the minimum W allowed for the process technology utilized in the low voltage threshold circuit. The multiple for W may be chosen to guarantee that sigma variability over each of the individual legs 325a-325d represents an average for the power gated circuit 115 being modeled. In various embodiments, the use of multiple legs 325a-325d accounts for variability in the fabrication process of the N-type devices in the first leakage monitor 325 itself. Accordingly, in various embodiments, each of the individual legs 325a-325d of the first leakage monitor 325 may be programmable. For example, in one set of embodiments, each individual leg 325a-325d may include an antifuse, allowing each of the legs to be programmed individually. Similarly, in various embodiments, the second leakage monitor 330 may also include multiple legs 330a, 330b, 330c, 330d.

As described with respect to FIG. 2, first and second capacitors 335, 340 may be configured to adjust the duration of the timeout. In some embodiments, as more legs of the first leakage monitor 325, and in turn more N-type devices are programmed, the first leakage monitor 325 will exhibit more subthreshold leakage. As a result, to account for the increased subthreshold leakage, additional and/or larger N-channel and P-channel capacitors may be added. In one set of embodiments, similar to the individual legs 325a-325d of the first leakage monitor 325, additional capacitors may be added via an antifuse.

In some embodiments, spare transistors 380 may also be provided. Spare transistors 380 may include one or more NMOS and one or more PMOS transistors. The spare transistors 380 may be configured to have the size and fabrication characteristics of the transistors utilized in the timeout control circuit 300, to replace one or more of the transistors in case of failure. For example, the spare transistors 380 may be configured to replace a failed transistor in the first or second precharge switch 315, 320; the first or second leakage monitors 325, 330; the first or second capacitors 335, 340; the first or second output inverters 345, 350; or in any other part of the timeout control circuit 300. In some embodiments, the spare transistors 380 may also be programmable through, without limitation, antifuses.

In various embodiments, the timeout control circuit 300 may further include a separate power gating enable circuit 385. In some embodiments, the control circuit enable signal may be a separately asserted signal to enable one or more power gating control circuits. When the control circuit enable signal is low, indicating that the power gating control circuit should be disabled, the power gating enable circuit 385 may cause respective N-channel and P-channel transistors to become conductive. This will pull the N-channel monitor node to $V_{SS}$, and P-channel monitor node to $V_{DD}$, preventing the timeout control circuit 300 from outputting a powerdown signal at powerdown NOR gate 375.

Figure 4:
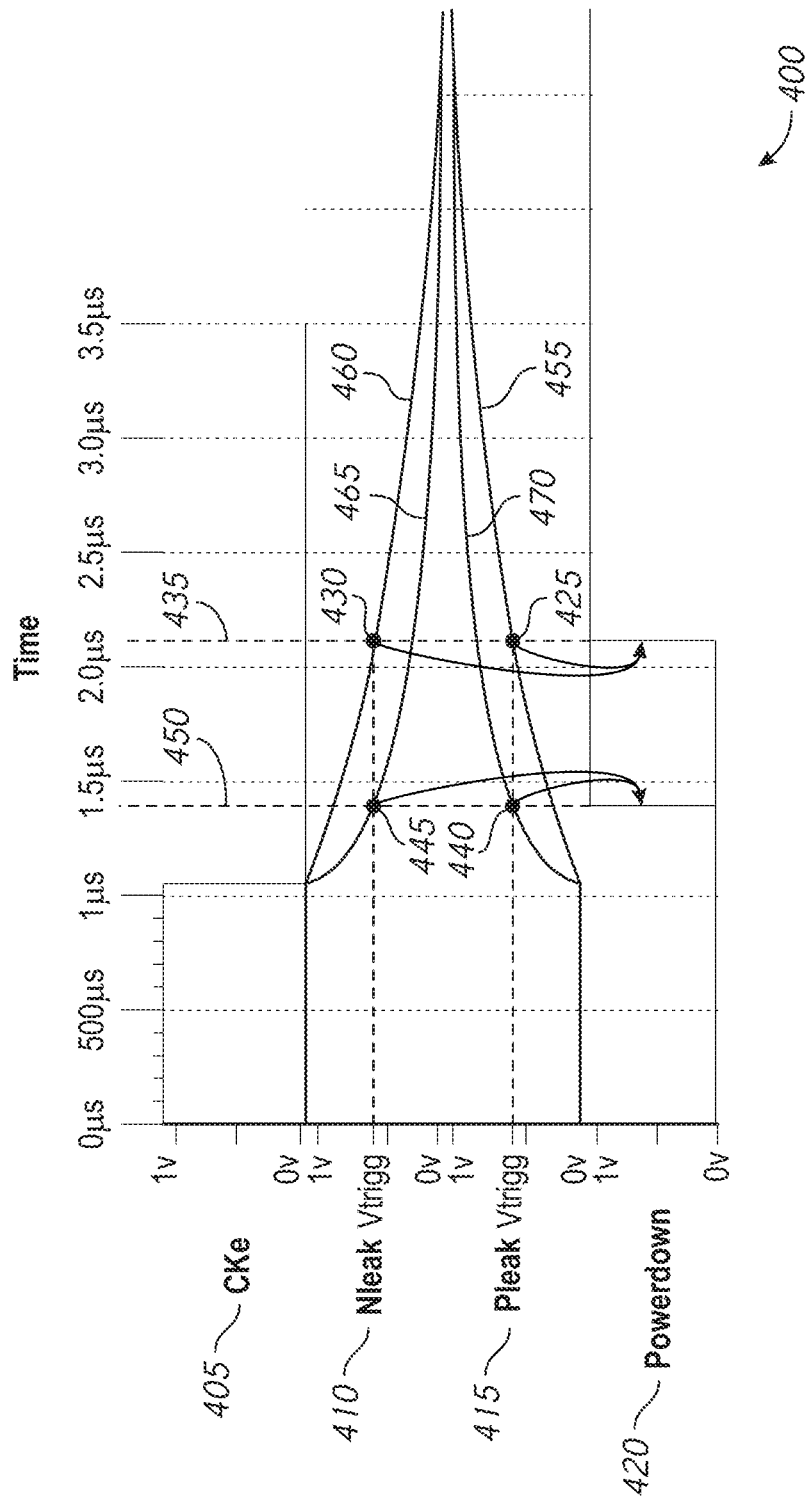
FIG. 4 illustrates voltage over time for a timeout control circuit, in accordance with various embodiments.

FIG. 4 illustrates voltage curves 400 over time in a temperature and process corner sensitive timeout control circuit, in accordance with various embodiments. The voltage curve shown in Cke 405 illustrates the clock enable signal on the Cke input line. The voltage curves shown in Nleak 410 illustrates the leakage of the precharge voltage at monitor node Nleak. Pleak 415 illustrates the leakage of the precharge voltage at the monitor node Pleak. Powerdown 420 illustrates when the powerdown signal is asserted relative to the other voltage curves.

In the embodiments depicted, voltage curve Cke 405 shows that the clock enable signal becomes low at 1.05 µs. In response, as depicted in Nleak 410, the voltage at monitor node Nleak starts to fall towards complement power rail $V_{SS}$, in this case at 0V. A first voltage curve 460, as shown in Nleak 410, may correspond to a voltage at the monitor node Nleak at a first temperature, and a second voltage curve 465, may correspond to a voltage at the monitor Nleak at a second temperature higher than the first temperature. The P-channel complement, depicted in Pleak 415, shows the precharge voltage at monitor node Pleak starts to rise towards complement power rail $V_{DD}$, in this case at 1V. A first voltage curve 455 of Pleak 415 may correspond to a voltage at the monitor node Pleak at the first temperature, and a second voltage curve 470 of Pleak 415 may correspond to a voltage at the monitor Pleak at the second temperature. For example, in one set of embodiments, the first temperature may be 25 C, and the second temperature may be 90 C. Whichever of Nleak 410 or Pleak 415 crosses the trigger voltage $V_{trigg}$ of the first trigger inverter 245, 345 or second trigger inverter 250, 350 will trigger the powerdown signal. As used herein, crossing $V_{trigg}$ may include both falling below $V_{trigg}$ at Nleak 410, or exceeding $V_{trigg}$ at Pleak 415. Therefore, whichever of the first leakage monitor 225, 325 or second leakage monitor 230, 330 has more leakage will determine the duration of the timeout. In this case, both the first voltage curve 460 of Nleak 410, and the first voltage curve 455 of Pleak 415 cross $V_{trigg}$ at points 425, 430, at substantially the same time at line 435—approximately 2.1 µs. The second voltage curve 465 of Nleak 410 and the second voltage curve 470 of Pleak 415 cross $V_{trigg}$ at points 445, 440 at substantially the same time at line 450—approximately 1.4 µs. This causes powerdown 420 to also be asserted high at approximately 2.1 µs at the first temperature, but at 1.4 µs at the second temperature. Accordingly, in various embodiments, the timeout duration may be the time between when clock enable becomes low and when the power down signal becomes high. Generally, the higher temperature, the shorter the timeout duration. For example, for the first temperature, clock enable becomes low at 1.05 µs and the powerdown signal becomes high at 2.1 µs.

Thus, in the illustrated embodiment, the timeout duration is approximately 1.05 μs at the first temperature. However, at the second temperature, the powerdown signal is activated at 1.4 μs corresponding to a timeout duration of 350 ns.

Figure 5:
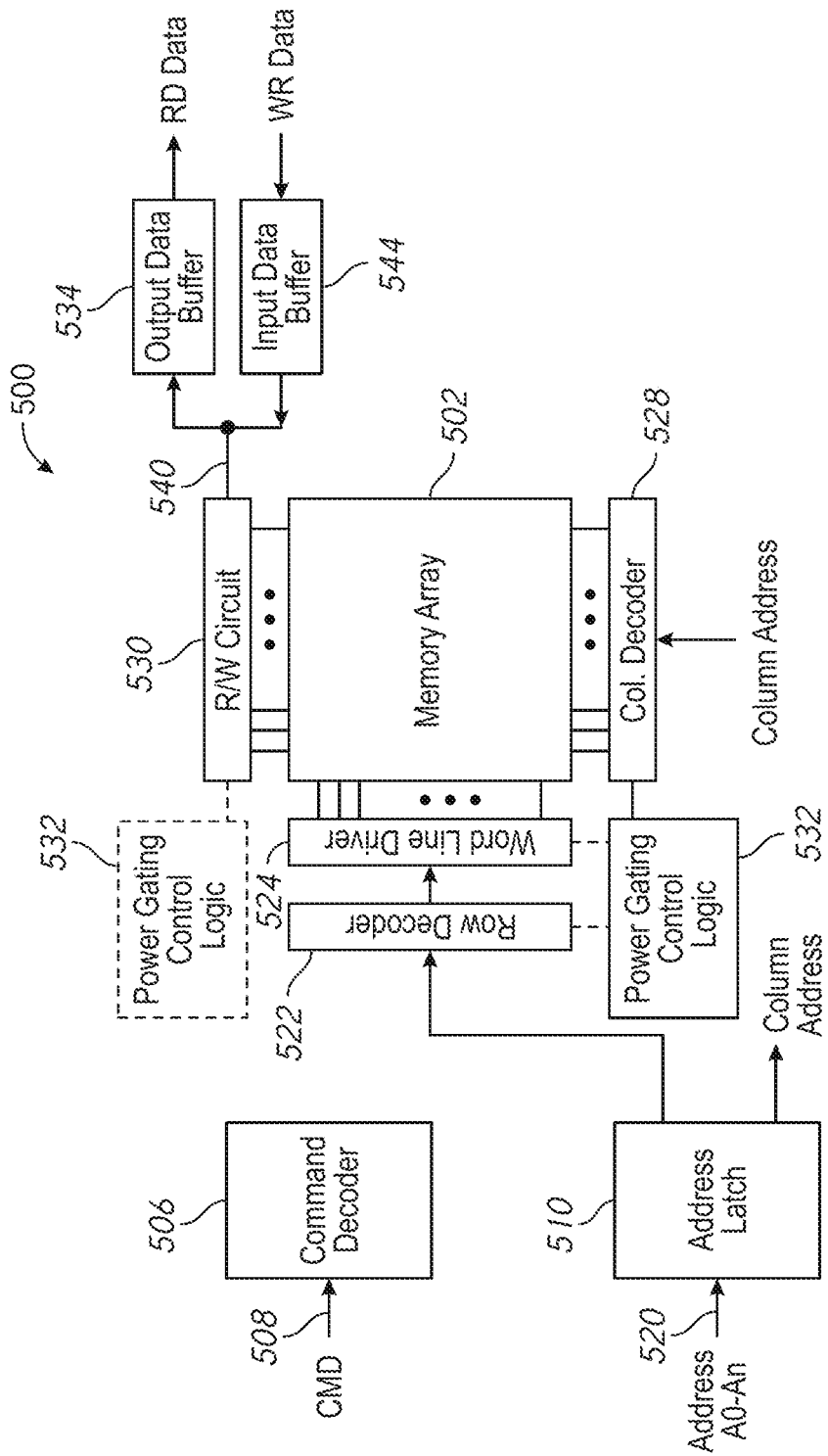
FIG. 5 is a block diagram of a memory system, in accordance with various embodiments.

FIG. 5 illustrates a block diagram of a portion of a memory system 500, in accordance with various embodiments. The system 500 includes an array 502 of memory cells, which may be, for example, volatile memory cells (e.g., dynamic random-access memory (DRAM) memory cells, low-power DRAM memory (LPDRAM), static random-access memory (SRAM) memory cells), non-volatile memory cells (e.g., flash memory cells), or other types of memory cells. The memory 500 includes a command decoder 506 that may receive memory commands through a command bus 508 and provide (e.g., generate) corresponding control signals within the memory 500 to carry out various memory operations. For example, the command decoder 506 may respond to memory commands provided to the command bus 508 to perform various operations on the memory array 502. In particular, the command decoder 506 may be used to provide internal control signals to read data from and write data to the memory array 502. Row and column address signals may be provided (e.g., applied) to an address latch 510 in the memory 500 through an address bus 520. The address latch 510 may then provide (e.g., output) a separate column address and a separate row address.

The address latch 510 may provide row and column addresses to a row address decoder 522 and a column address decoder 528, respectively. The column address decoder 528 may select bit lines extending through the array 502 corresponding to respective column addresses. The row address decoder 522 may be connected to a word line driver 524 that activates respective rows of memory cells in the array 502 corresponding to received row addresses. The selected data line (e.g., a bit line or bit lines) corresponding to a received column address may be coupled to a read/write circuitry 530 to provide read data to an output data buffer 534 via an input-output data path 540. Write data may be provided to the memory array 502 through an input data buffer 544 and the memory array read/write circuitry 530.

Power gating control logic 532 may include all or part of one or more timeout control circuits. The power gating control logic 532 may selectively couple various power gated domains to a primary power supply when the power gated circuit is to be accessed. The timeout control circuits of the power gating control logic 532 may selectively provide power to access circuitry for each of one or more internal circuits. For example, access circuitry may include, without limitation, all or part of row decoder 522, word line driver 524, column decoder 528, sense amplifiers, sense amplifier gap control logic, and R/W circuit 530. As described with respect to the figures above, when a clock enable is low, and the one or more power gated circuits are inactive, the power gating control logic 532, via the one or more timeout control circuits, may be configured to generate a timeout responsive to both temperature and process corner of the one or more power gated circuits, respectively.

Figure 6:
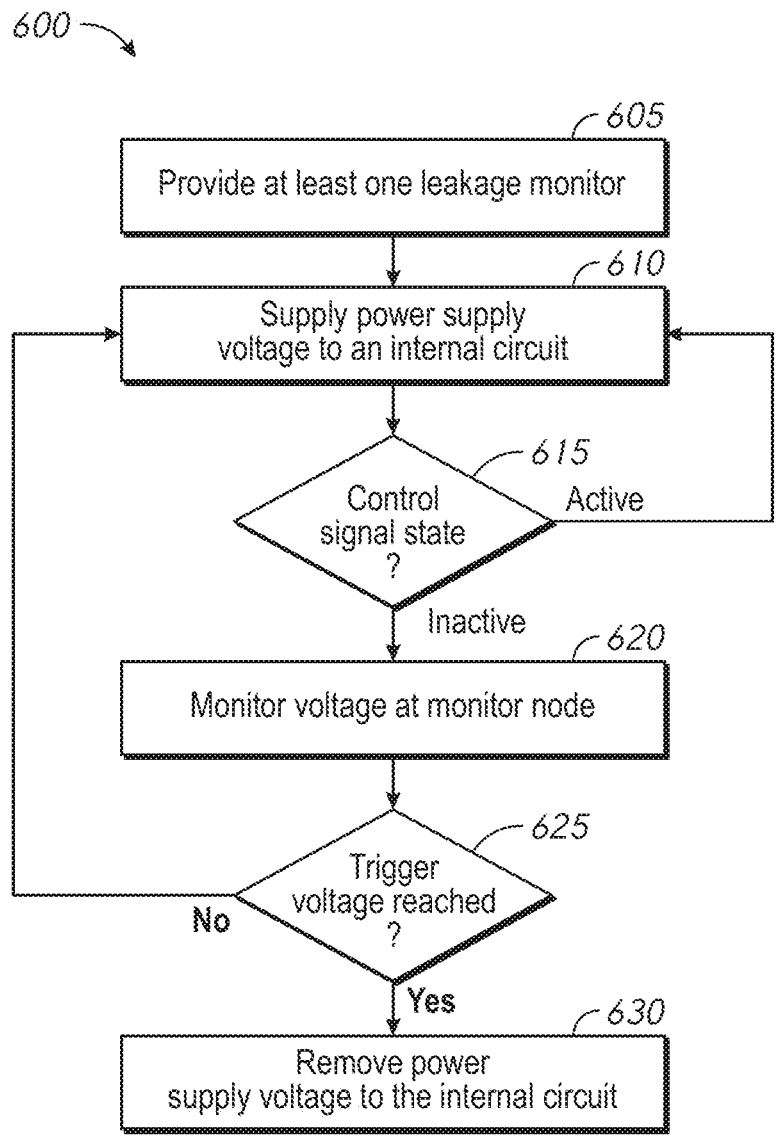
FIG. 6 is a flow chart of a process for power gated domains, in accordance with various embodiments.

FIG. 6 illustrates a flow chart of a method 600 for temperature and process corner sensitive control of a power gated domain, in accordance with various embodiments. The method begins, at block 605, by providing at least one leakage monitor coupled to a monitor node. As described with respect to FIGS. 2 & 3 above, in various embodiments, the leakage monitor may be an N-channel leakage monitor corresponding to the first leakage monitor 225, 325, or a P-channel leakage monitor corresponding to second leakage monitor 230, 330, or both. In various embodiments, the at least one leakage monitor may be configured to model the leakage through all N-type devices or P-type devices in a power gated circuit, sensitive to both temperature conditions and process corner of the power gated circuit.

The method 600 continues, at block 610, by supplying a power supply voltage to the power gated circuit. In various embodiments, the power gated circuit may be coupled to a first power supply voltage via a header switch. In some embodiments, the power gated circuit may be coupled to a second power supply voltage via a footer switch. In further embodiments, both a header and footer switch may be provided to couple the power gated circuit to first and second power supply voltages, respectively. In various embodiments, while the power gated circuit is powered, and correspondingly the clock enable signal is high, the power gating circuit may precharge a corresponding monitor node Nleak, or corresponding monitor node Pleak.

At decision block 615, the state of the clock enable signal is determined, via a timeout control circuit, at Cke input. When clock enable is high (active), at block 610, a power supply voltage continues to be supplied to the power gated circuit. However, when clock enable is low (inactive), at block 620, the method 600 continues by monitoring a voltage at the monitor node. In various embodiments, this may occur at monitor node Nleak, monitor node Pleak, or both monitor nodes Nleak and Pleak. Therefore one or more of the N-channel or P-channel leakage of the power gated circuit may be independently monitored.

At decision block 625, it may be determined, via a timeout control circuit, whether a trigger voltage has been reached at either of monitor node Nleak or monitor node Pleak. In various embodiments, the trigger voltage $V_{trigg}$ may be configured to be between the first power supply voltage and the second power supply voltage. If the trigger voltage has not been reached, at block 610, power supply voltage continues to be provided to the power gated circuit. If the trigger voltage has been exceeded, then, at block 630, the method 600 continues by removing power supply voltage from the power gated circuit.

While certain features and aspects have been described with respect to exemplary embodiments, one skilled in the art will recognize that various modifications and additions can be made to the embodiments discussed without departing from the scope of the invention. Although the embodiments described above refer to particular features, the scope of this invention also includes embodiments having different combination of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. An apparatus comprising:
a control signal input configured to receive an enable signal;
a first switch configured to couple a power gated circuit to at least one of a first supply
voltage or a second supply voltage, wherein the first switch comprises a high threshold voltage transistor having a threshold voltage greater than a threshold voltage of a transistor included in the power gated circuit; and
a timeout circuit coupled to the first switch, the timeout, circuit comprising:
a monitor node,
a second switch comprising a first transistor, a gate of the first transistor coupled to the control signal input, a first node of the first transistor coupled to one of the first supply voltage or the second supply voltage, and a second node of the first transistor coupled to the monitor node, wherein responsive to the enable signal being at a first logic level, the second switch is configured to disconnect the monitor node from one of the first supply voltage or the second supply voltage,
a leakage monitor comprising at least one transistor coupled to the monitor node at a first node of the at least one transistor, wherein the leakage monitor is configured to exhibit a same process corner and model subthreshold leakage as in the power gated circuit corresponding to a defined temperature of the power gated circuit, and
an output logic coupled to the monitor node and configured to deactivate the first switch when the enable signal is at the first logic level and when a timeout period has elapsed, wherein the timeout period elapsing is based at least in part on a voltage at the monitor node crossing a trigger voltage of the output logic,
wherein the leakage monitor is further configured to inversely alter a length of the timeout period based at least in part on a change in an operating temperature of an internal circuit.

2. The apparatus of claim 1, wherein the leakage monitor is configured to simulate leakage through N-type devices in the power gated circuit, wherein the leakage monitor is sized with a same channel length and a width that is no less than five times a minimum width for a process technology utilized by the N-type devices in the power gated circuit.

3. The apparatus of claim 1, wherein the timeout circuit comprises a further switch coupled to the control signal input, wherein when the enable signal is at the first logic level, the further switch is configured to disconnect a second monitor node from the second supply voltage.

4. The apparatus of claim 3, wherein the timeout circuit further comprises
a second leakage monitor coupled to the second monitor node, wherein the second leakage monitor is configured to simulate leakage through P-type devices in the power gated circuit responsive to the defined temperature and the process corner of the power gated circuit.

5. The apparatus of claim 3, wherein the output logic is configured to deactivate the first switch when the enable signal is at the first logic level and at least one of the voltage at the monitor node crosses the trigger voltage or a second voltage at the second monitor node crosses a second trigger voltage of the output logic.

6. The apparatus of claim 1, further comprising a third switch, configured to couple the power gated circuit to the second supply voltage, wherein the first switch is configured to couple the power gated circuit to the first supply voltage.

7. The apparatus of claim 1, wherein the leakage monitor comprises a plurality of legs, each of the plurality of legs comprising at least one transistor.

8. The apparatus of claim 1, wherein the timeout circuit further comprises a capacitor comprising a transistor having a gate coupled to the monitor node and the output logic, wherein the timeout period for the voltage at the monitor node to cross the trigger voltage is based, at least in part, on the size of the capacitor.

9. The apparatus of claim 1, further comprising:
a power supply line; and
a power gating control circuit configured to respond, at least in part, to a first change from
a first state to a second state of a control signal to initiate supplying a power supply voltage from the power supply line to the internal circuit, and continue supplying the power supply voltage from the power supply line to the internal circuit for at least the timeout period from a second change from the second state to the first state of the control signal, wherein the timeout period is configured to represent temperature dependency.

10. The apparatus of claim 9, wherein the power gating control circuit is configured to reset a detection of the timeout period when a third change from the first state to the second state occurs during the timeout period.

11. A method comprising:
receiving an enable signal;
coupling, via a first switch, a power gated circuit to at least one of a first supply voltage or a second supply voltage, wherein the first switch comprises a high threshold voltage transistor having a threshold voltage greater than a threshold voltage of a transistor included in the power gated circuit;
responsive to the enable signal being at a first logic level received at a gate of a first transistor, disconnecting, via the first transistor, a monitor node coupled to a first node of the first transistor from one of the first supply voltage or the second supply voltage coupled to a second node of the first transistor;
exhibiting at a leakage monitor coupled to the monitor node a same process corner as the power gated circuit;
monitoring, via the leakage monitor coupled to the monitor node, a same model subthreshold leakage as in the power gated circuit corresponding to a defined temperature of the power gated circuit;
deactivating the first switch when the enable signal is at the first logic level and when a timeout period has elapsed, wherein the timeout period elapsing is based at least in part on a voltage at the monitor node crossing a trigger voltage; and inversely altering a length of the timeout period based at least in part on a change in an operating temperature of an internal circuit.

12. The method of claim 11, further comprising simulating leakage through N-type devices in the power gated circuit, wherein the leakage monitor is sized with a same channel length and a width that is no less than five times a minimum width for a process technology utilized by the IN-type devices in the power gated circuit.

13. The method of claim 11, further comprising simulating leakage through P-type devices in the power gated circuit responsive to the temperature and the process corner of the power gated circuit, wherein the leakage monitor is sized with a same channel length and a width that is no less than five times a minimum width for a process technology utilized by the P-type devices in the power gated circuit.

14. The method of claim 11, responsive to the enable signal being at the first logic level, disconnecting a second monitor node from the second power supply.

15. The method of claim 14, further comprising deactivating the first switch responsive to the enable signal being at the first logic level and at least one of the voltage at the monitor node crosses the trigger voltage or a second voltage at the second monitor node crosses a second trigger voltage.

16. The method of claim 11, further comprising responding, at least in part, to a first change from a first state to a second state of a control signal by initiating supplying a power supply voltage from a power supply line to the internal circuit.

17. The method of claim 16, wherein supplying the power supply voltage from the power supply line to the internal circuit continues for at least the timeout period from a second change from the second state to the first state of the control signal, wherein the timeout period is configured to represent temperature dependency.

18. The method of claim 17, further comprising resetting a detection of the timeout period responsive to a third change from the first state to the second state appearing during the timeout period.

19. The method of claim 16, further comprising detecting an amount of leakage current of the internal circuit to set the timeout period.

20. The apparatus of claim 1, wherein the enable signal is a clock enable signal.

21. The apparatus of claim 1, wherein the high threshold voltage transistor comprises a complementary metal oxide semiconductor (CMOS) transistor.

* * * * *